(12) United States Patent
Malocha (10) Patent No.: US 7,623,037 B1
(45) Date of Patent: Nov. 24, 2009

(54) MULTI-TRANSDUCER/ANTENNA SURFACE ACOUSTIC WAVE DEVICE SENSOR AND TAG

(75) Inventor: Donald C. Malocha, Winter Springs, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 418 days.

(21) Appl. No.: 11/521,708

(22) Filed: Sep. 15, 2006

Related U.S. Application Data (63) Continuation-in-part of application No. 11/203,260, filed on Aug. 12, 2005.

(60) Provisional application No. 60/650,843, filed on Feb. 8, 2005, provisional application No. 60/718,575, filed on Sep. 19, 2005.

(51) Int. Cl.
*G08B 13/14* (2006.01)
*H03H 9/00* (2006.01)
*H04B 1/00* (2006.01)

(52) U.S. Cl. ............... 340/572.1; 340/572.2; 340/572.5; 340/572.7; 333/193; 333/195; 333/196; 375/151; 375/153

(58) Field of Classification Search ............... 340/10.1, 340/572.1–572.9, 573.1, 573.4, 5.25, 5.7, 340/5.8; 235/375–385; 333/193–196; 375/151, 375/153
See application file for complete search history.

(56) References Cited

U.S. PATENT DOCUMENTS

| 4,370,633 | A | * | 1/1983 | Schofield | 333/195 |
| 4,746,830 | A | * | 5/1988 | Holland | 310/313 D |
| 5,217,018 | A | * | 6/1993 | Dias | 600/463 |
| 5,670,920 | A | * | 9/1997 | Morgan | 333/195 |
| 7,005,964 | B2 | * | 2/2006 | Edmonson et al. | 340/10.1 |
| 2002/0105392 | A1 | * | 8/2002 | Fujii | 333/193 |
| 2005/0001699 | A1 | * | 1/2005 | Takamine | 333/195 |
| 2006/0049714 | A1 | * | 3/2006 | Liu et al. | 310/313 R |

OTHER PUBLICATIONS

Malocha, D.C., Puccio, D., Gallagher, D., [online], retrieved on Aug. 17, 2006, "SAW Sensors Using Orthogonal Frequency Coding," (2004) IEEE International . . . , Publication, 4 pages, Retrieved from: http://www.caat.engr.ufc.edu/Publications/SAW%20Sensors%20Orthogonal%20Frequency%20Coding.pdf.

(Continued)

*Primary Examiner*—Daniel Wu
*Assistant Examiner*—Mark Rushing
(74) *Attorney, Agent, or Firm*—Brian S. Steinberger; Phyllis K. Wood; Law Offices of Brian S. Steinberger, P.A.

(57) ABSTRACT

A surface acoustic wave sensor or tag having multiple transducer/antenna pairs each having a different center frequency. The bandwidth of each transducer/antenna pair is inversely proportional to the number of transducer/antennas pairs used and the bandwidth is the sum of the bandwidth of the transducer/antenna pairs. Implementing a SAW sensor or tag with multiple transducer/antenna pairs significantly reduces device losses and improves the performance of the device since the individual transducer/antenna pair's fractional bandwidth is reduced by the ratio of the system bandwidth to the number of transducer antenna pairs used in the sensor.

20 Claims, 11 Drawing Sheets

OTHER PUBLICATIONS

Malocha, D.C., Puccio, D., Gallagher, D., "Orthogonal Frequency Coding for SAW Device Applications," *Ultrasonics Symposium, (2004) IEEE*, vol. 2, Aug. 23-27, 2004, pp. 1082-1085, vol. 2, Digital Object Identifier 10.1109/ULTSYM.2004.1417965.

"Orthogonal Frequency Coding for SAW Tagging and Sensors," [Online] 1 page, [retrieved on Aug. 11, 2006] (2006) Inst. Of Electrical and Electronics Engineers, Abstract Only, Retrieved from: http://www.ieee-uffc.org/archive/uffc/trans/Toc/abs/06/t0620377.htm.

Puccio, D., Malocha, D.C., Saldanha, N., "Implementation of Orthogonal Frequency Coded SAW Devices Using Apodized Reflectors," *Frequency Control Symposium and Exposition, 2005, Proceedings of the 2005 IEEE International*, Aug. 29-31, 2005, pp. 892-896, Digital Object Identifier 10.1109/FREQ.2005.1574051.

S.E. Carter and D.C. Malocha, "SAW device implementation of a weighted stepped chirp code signal for direct sequence spread spectrum communication systems", IEEE Transactions on Ultrasonics, Ferroelectrics, and Frequency control, vol. 47, Jul. 2000, pp. 967-973.

T. Omori, J. Akasaka, M. Arai, K. Hashimoto, M. Yamaguchi, "Optimisation of weighted SAW grating reflectors with minimized time delay deviation," Proc. IEEE International Frequency Control Symposium and PDA Exhibition, 2001, pp. 666-670.

P.V. Wright, "Modeling and experimental measurements of the reflection properties of SAW metallic gratings," Proc. IEEE International Ultrasonics Symposium, 1984, pp. 54-63.

W.J. Tanski, "SAW resonators utilizing withdrawal weighted reflectors," IEEE Transactions on Sonics and Ultrasonics, vol. 26, No. 6, pp. 404-410, Nov. 1979.

P.D. White, R.F. Mitchell, R. Stevens, P. Moore, M. Redwood, "Synthesis and design of weighted reflector banks for SAW resonators," Proc. IEEE International Ultrasonics Symposium, 1978, pp. 634-638.

\* cited by examiner

MULTI-TRANSDUCER/ANTENNA SURFACE ACOUSTIC WAVE DEVICE SENSOR AND TAG

This application is a continuation-in-part of U.S. application Ser. No. 11/203,260 filed on Aug. 12, 2005 which claims the benefit of priority to U.S. Provisional Application No. 60/650,843 filed on Feb. 8, 2005 and claims the benefit of priority to U.S. Provisional Patent Application No. 60/718,575 filed on Sep. 19, 2005 and was sponsored in part through NASA Graduate Student Research Program (GSRP).

FIELD OF THE INVENTION

This invention relates to surface acoustic wave devices and, in particular, to apparatus, systems, devices and methods for using multiple surface acoustic wave transducers and antenna pairs in an orthogonal frequency coded surface acoustic wave sensor or tag.

BACKGROUND AND PRIOR ART

The surface acoustic wave (SAW) sensor offers advantages in that it is wireless, passive, small and has varying embodiments for different sensor applications. Surface acoustic wave (SAW) sensors are capable of measuring physical, chemical and biological variables and have the ability to operate in harsh environments. In addition, there are a variety of ways of encoding the sensed data information for retrieval. Single sensor systems can typically use a single carrier RF frequency and a simple device embodiment, since tagging is not required. In a multi-sensor environment, it is necessary to both identify the sensor as well as obtain the sensed information. The SAW sensor then becomes both a sensor and a tag and must transmit identification and sensor information simultaneously.

Known SAW devices include delay line and resonator-based oscillators, differential delay lines, and devices utilizing multiple reflective structures. Single sensor systems can typically use a single carrier frequency and a simple coding technique, since tagging is not required. However, there are advantages of using spread spectrum techniques for device interrogation and coding, such as enhanced processing gain and greater interrogation power.

The use of orthogonal frequencies for a wealth of communication and signal processing applications is well known to those skilled in the art. Orthogonal frequencies are often used in an M-ary frequency shift keying (FSK) system. There is a required relationship between the local, or basis set, frequencies and their bandwidths which meets the orthogonality condition. If adjacent time chips have contiguous local stepped frequencies, then a stepped chirp response is obtained. See S. E. Carter and D. C. Malocha, "SAW device implementation of a weighted stepped chirp code signal for direct sequence spread spectrum communication systems", IEEE Transactions on Ultrasonics, Ferroelectrics, and Frequency control, Vol. 47, July 2000, pp. 967-973.

Co-pending U.S. patent application Ser. No. 11/508,674 filed on Aug. 23, 2006 assigned to the same assignee as the present application, teaches weighted surface acoustic wave reflector gratings for coding identification tags and sensors to enable unique sensor operation and identification for a multi-sensor environment. In an embodiment, the weighted reflectors are variable while in another embodiment the reflector gratings are apodized. The weighting technique allows the designer to decrease reflectively and allows for more chips to be implemented in a device and, consequently, more coding diversity. As a result, more tags and sensors can be implemented using a given bandwidth when compared with uniform reflectors. Use of weighted reflector gratings with OFC makes various phase shifting schemes possible, such as in-phase and quadrature implementations of coded waveforms resulting in reduced device size and increased coding. The device may include a single transducer/antenna pair with a bank of reflectors on one side of the transducer/antenna pair, or a bank of reflectors on both sides of the transducer/antenna pair, or alternatively, a unidirectional transducer may be used to reduce the device loss and size.

SUMMARY OF THE INVENTION

A primary objective of the invention is to provide methods, system, apparatus and devices for producing wireless, passive SAW sensors have a very small size and a cost of only a few cents each in quantities of millions.

A secondary objective of the invention is to provide methods, systems, apparatus and devices with multiple transducers and antennas for use with orthogonal frequency coded SAW tags for temperature, pressure, gas and liquid sensors.

A third objective of the invention is to provide methods, systems, apparatus and devices for increasing the wireless sensor and tag range by reducing the device loss.

A fourth objective of the invention is to provide methods, systems, apparatus and devices for SAW sensors and tags using multiple transducer/antenna pairs each having a different center frequency to increase bandwidth, further reduce device loss and improve overall performance.

A fifth objective of the invention is to provide methods, systems, apparatus and devices that increases the bandwidth of a orthogonal frequency coded SAW sensors and tags.

A first preferred embodiment of the invention provides a surface acoustic wave device including a substrate having at least two banks of reflectors fabricated thereon for producing at least two contiguous stepped frequencies having a different center frequency within a bandwidth and at least two transducer and antenna pairs each having a different bandwidth coupled with one of the at least two banks of reflectors for receiving an orthogonal frequency coded signal generated by a corresponding one of the at least two banks of reflectors, at least two transducer and antenna pairs each having a different bandwidth on the substrate, each of the at least two transducer/antenna pairs coupled with one of the at least two banks of reflectors for receiving an orthogonal frequency coded signal generated by a corresponding one of the at least two banks of reflectors, wherein the bandwidth of each transducer/antenna pair is inversely proportional to the number of transducer/antennas pairs used. Each of the least two banks of reflectors include plural different first reflector grating coupled together, each of said plural different first and second reflector gratings comprises a first reflector grating producing a first frequency; and a second reflector grating producing a second frequency, the first frequency and the second frequency are orthogonal within a bandwidth. The loss of the SAW device is reduced by using multiple transducer/antenna pairs and the overall performance is improved.

A second preferred embodiment provides a system for identifying a surface acoustic wave device. The system includes a tag for identifying the surface acoustic wave device, the tag having at least two channels. Each channel includes a bank of reflectors and a transceiver/antenna pair coupled with said bank of reflectors for receiving an orthogonal interrogation signal at said tag and transmitting an orthogonal coded signal generated by said tag in response to said orthogonal interrogation signal, wherein each of said transceiver/antenna pairs have a different center frequency. A transceiver in communication with the surface acoustic wave device transmits the orthogonal interrogation signal to the surface acoustic wave device and receives the orthogonal coded signal from said tag in response.

A third preferred embodiment provides a method for producing a surface acoustic wave device comprising the steps of applying at least two transceiver/antenna pairs to a substrate, fabricating plural reflector grating on said substrate to form at least two banks of reflectors, said at least two banks of reflector gratings coupled with said at least two transceiver/antenna pairs for producing an orthogonal frequency coded signal, each of said at least two transceiver/antenna pairs and corresponding bank of reflectors having a different center frequency. The plural reflector gratings are shuffled to produce a different orthogonal frequency coded signal and the code is determined by the order in which the contiguous orthogonal frequencies are used.

Further objects and advantages of this invention will be apparent from the following detailed description of preferred embodiments which are illustrated schematically in the accompanying drawings.

DESCRIPTION OF THE PREFERRED EMBODIMENTS

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:

| | |
|---|---|
| 200 | OFC SAW system |
| 210 | tag |
| 220 | up-chirp |

-continued

| | |
|---|---|
| 230 | tag impulse response |
| 240 | down-chirp |
| 300 | sensor/tag |
| 300A | set of reflectors |
| 300B | set of reflectors |
| 305 | propagation |
| 310A | first bank of reflectors |
| 310B | first bank of reflectors |
| 315 | first antenna |
| 320A | second bank of reflectors |
| 320B | second bank of reflectors |
| 325 | second antenna |
| 330 | first transducer |
| 340 | second transducer |

Figure 1:
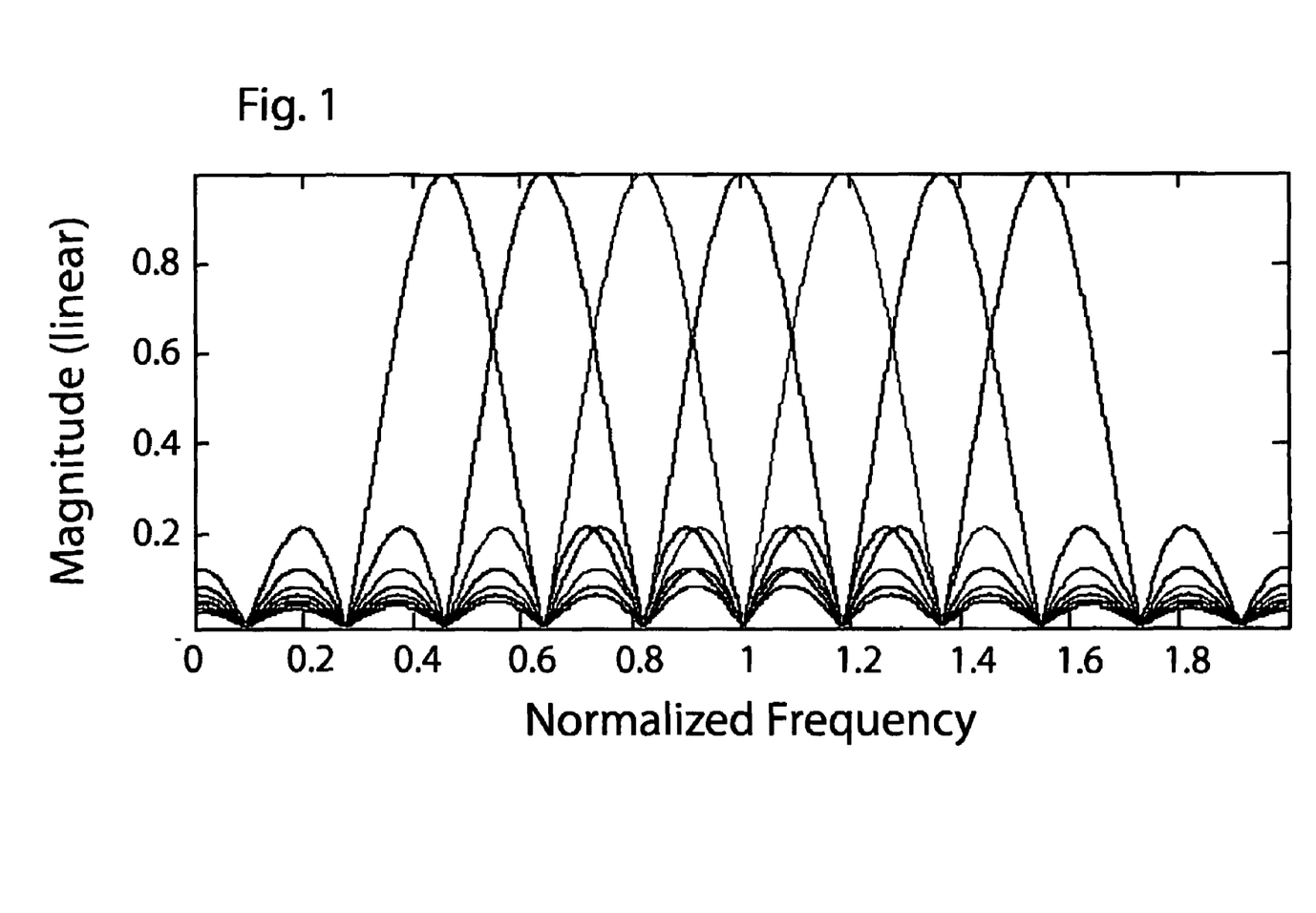
FIG. 1 is an example of a stepped chirp response.

It would be useful to review orthogonal frequency before discussing the method, system apparatus and device for using orthogonal frequency coding of the present invention. Orthogonal frequencies are used to spread the signal bandwidth. The orthogonality condition describes a relationship between the local chip frequencies and their bandwidths. As an example, consider the stepped linear chirp shown in FIG. 1. Seven coherent carriers are used to generate the signal shown. Each chip contains an integer number of carrier half cycles due to the orthogonality condition. Under these conditions, the resulting waveform is continuous. The conditions, however, do not require that the local frequency of adjacent chips, that are contiguous in time, be contiguous in frequency. Instead, the time function of a bit provides a level of frequency coding by allowing a shuffling of the chip frequencies in time.

Figure 2:
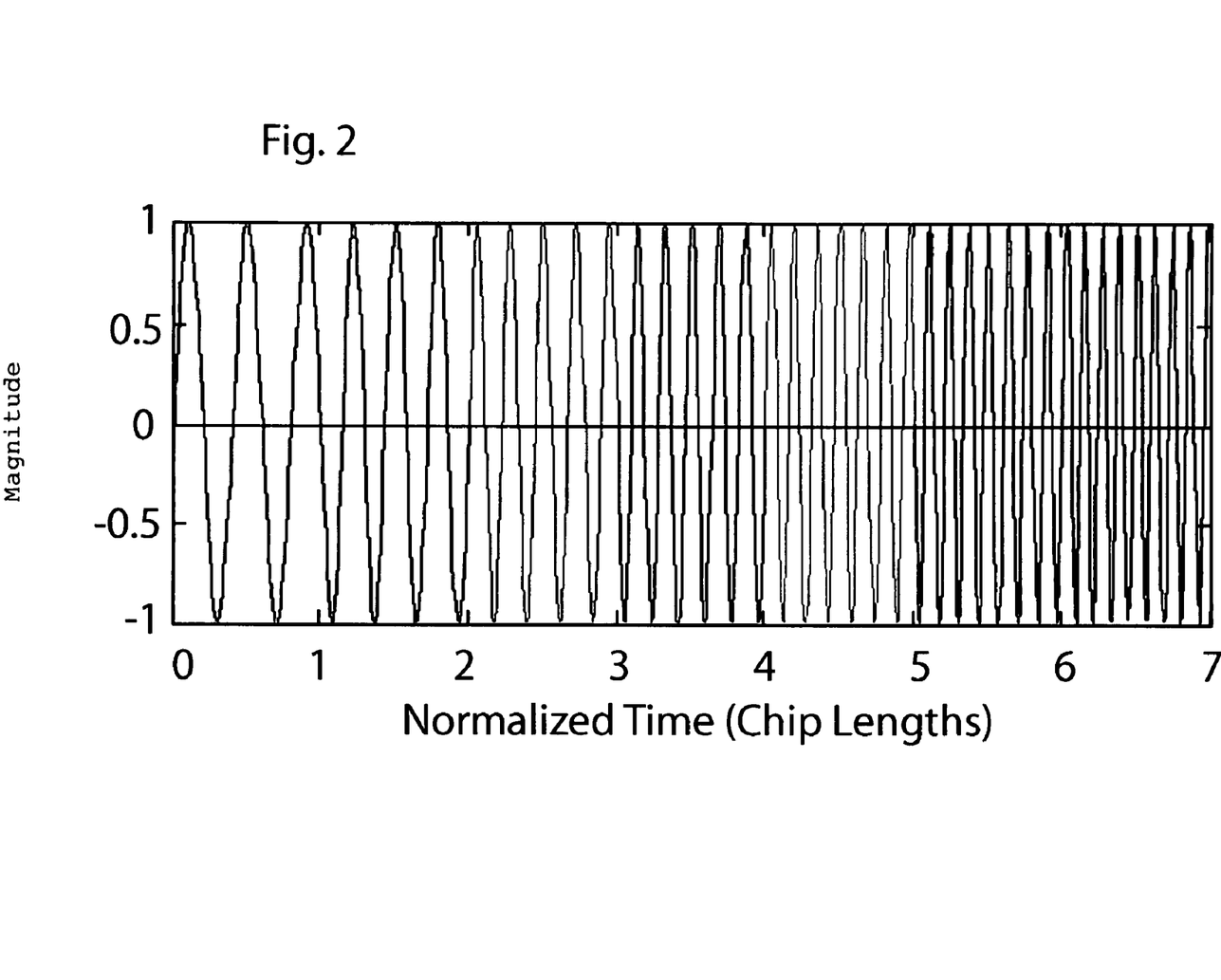
FIG. 2 is an example of an OFC chip frequency response.
Figure 3:
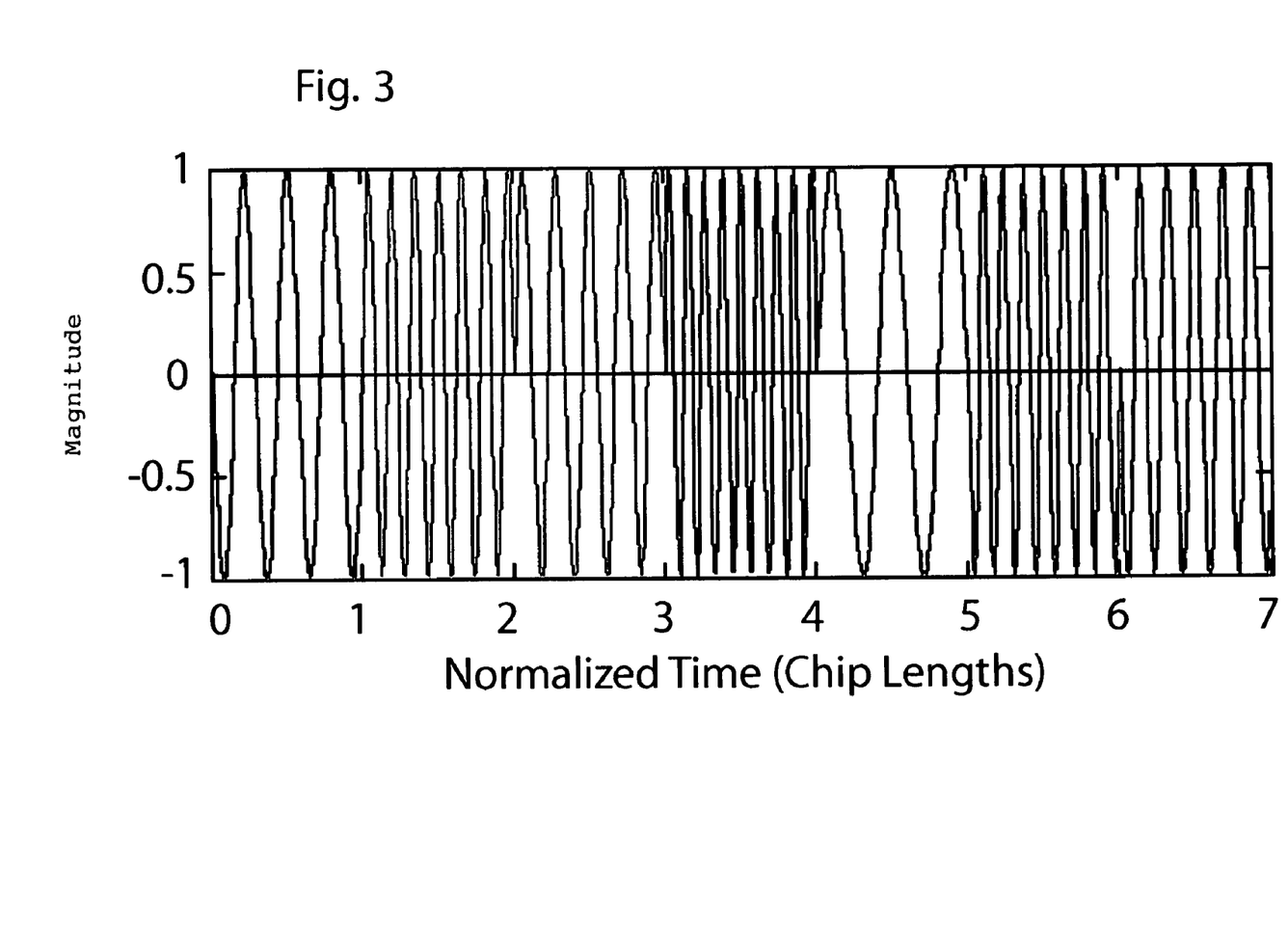
FIG. 3 is an example of a 7 chip OFC waveform based on the placement of chips.

The chip frequency response is shown in FIG. 2. These responses are a series of sampling functions with null bandwidths equal to $2 \cdot \tau^{-1}$. In addition, the sampling function center frequencies are separated by multiples of $\tau^{-1}$. Coding is accomplished by shuffling the chips to produce signal such as shown in FIG. 3, wherein the adjacent frequencies are not required to be sequential. The code is now determined by the order in which the orthogonal frequencies are used. Both signals occupy the same bandwidth and the coded information is contained within the signal phase. A more complete description of orthogonal frequency coding is given in D. C. Malocha, et al., "Orthogonal frequency coding for SAW device application," 2004 IEEE International Ultrasonics, Ferroelectrics, and Frequency Control 50th Anniversary Joint Conference, in press, which is incorporated herein by reference.

In the example shown in FIG. 3, the seven local chip frequencies are contiguous in frequency but are not ordered sequentially in time and the chip weights are all unity. If the local chip frequencies were ordered high to low or low to high, the time sequence would be a stepped down-chirp and up-chirp, respectively. The start of the chip carrier frequency begins at zero amplitude, as seen in FIGS. 2 and 3, which is a condition of the orthogonality.

The OFC technique provides a wide bandwidth spread spectrum signal with all the inherent advantages obtained from the time-bandwidth product increase over the data bandwidth. The OFC concept allows for a wide bandwidth, chirp interrogation, frequency and binary coding per bit, a reduced compressed pulse width as compared to a PN sequence, and a secure code. The OFC technique of the present invention can be applied to ultra-wide-band applications since the fractional bandwidth can exceed 20% and can be used in a multi-tag or sensor environment by using proper coding techniques.

Co-pending U.S. application Ser. No. 11/203,260 filed on Aug. 12, 2005 having same assignee as the subject application and having a common inventor with the subject application describes methods and systems for generating, distributing, processing and detecting orthogonal frequency coding for surface acoustic wave and silicon tags and sensors for transmission of sensor identification and information is hereby incorporated by reference. The spread spectrum coding uses orthogonal frequency coding for surface acoustic wave identification tags and sensors which enables unique sensor operation and identification in multi-sensor environments.

Figure 4:
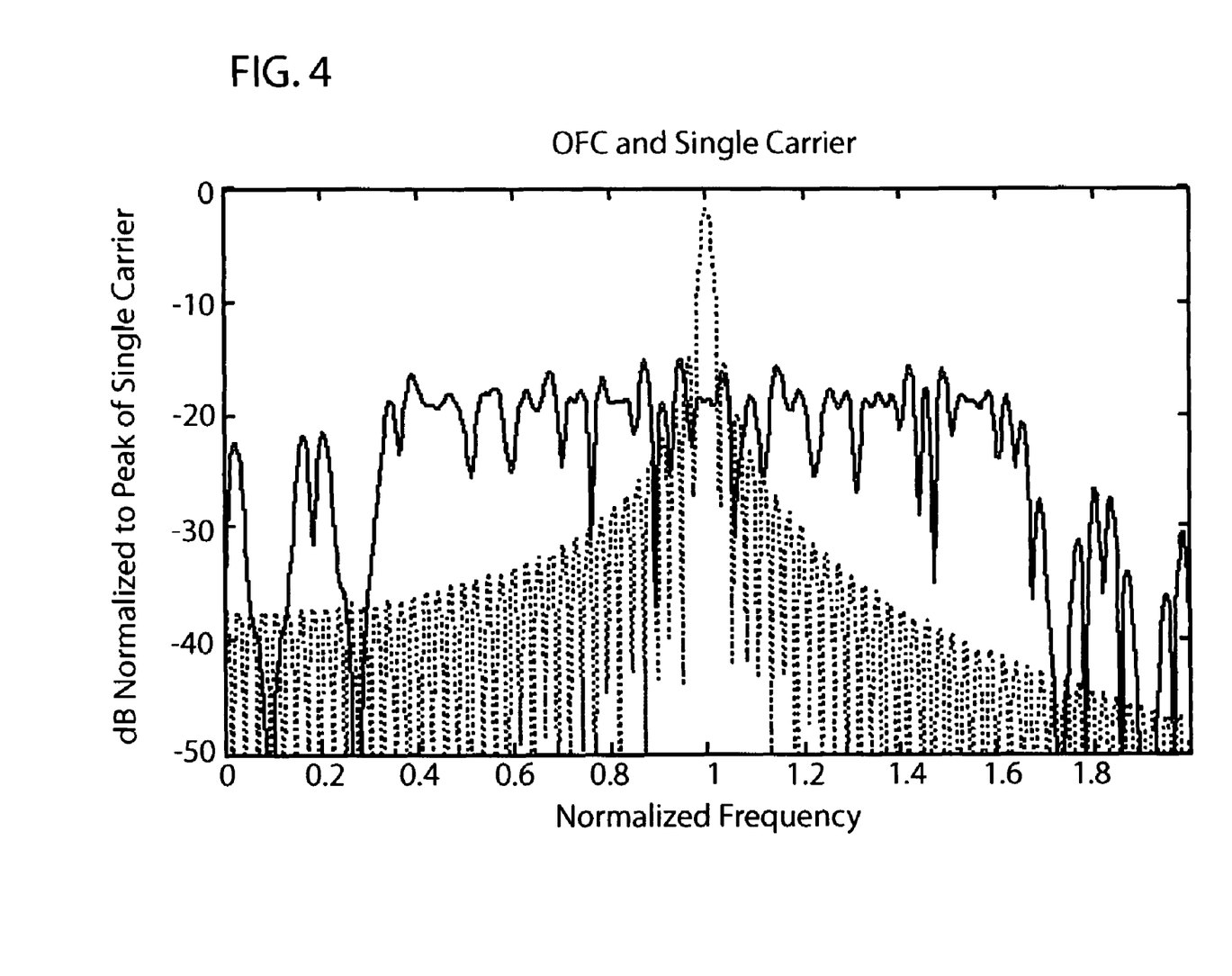
FIG. 4 is a frequency response of a 7 chip OFC device and a single carrier.
Figure 5:
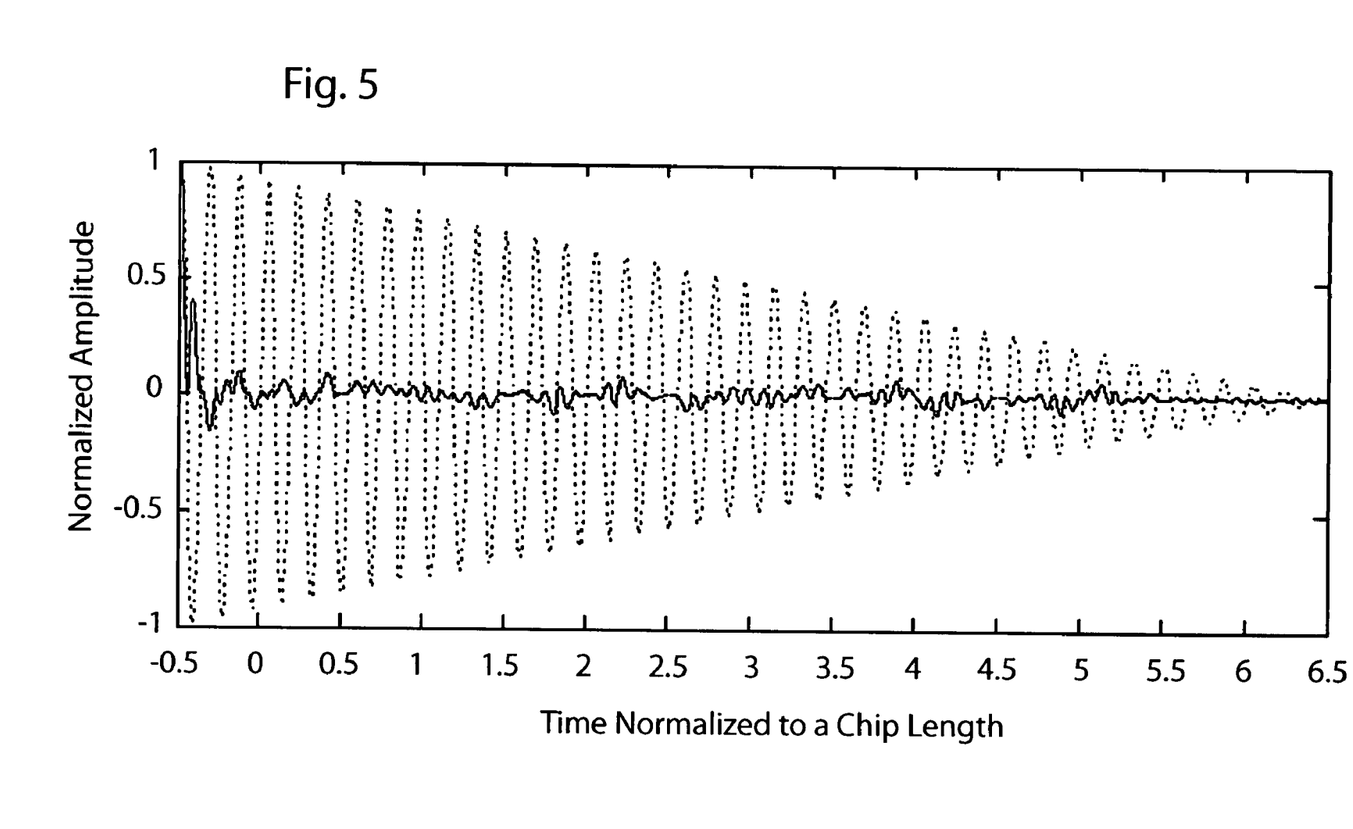
FIG. 5 shows the time autocorrelation of a single carrier BPSK and a 7 chip OFC signals having approximately the same time length.

The given chip sequence represents the OFC for the bit. If there are J-chips with J different frequencies in a bit, then there are J factorial possible permutations of the frequencies within the bit. A signal can be composed of multiple bits, with each bit having the same OFC or differing OFC. For the case of a signal, J-chips long and having a single carrier frequency, the signal is a simple gated RF burst $\tau_B$ long. The frequency responses of a 7 bit OFC (solid line) and a single carrier signal (dashed line) are shown in FIG. 4, with both time functions normalized to unity and having identical impulse response lengths. The single carrier, shown as the dashed line, is narrowband and has approximately 17 dB greater amplitude at center frequency, as compared to the OFC (J=7), shown as a solid line, which has a much wider bandwidth. FIG. 5 shows the time autocorrelation (½ length) of a single carrier BPSK (dashed line) and a 7 chip OFC (solid line) signals having approximately the same time length. The peak autocorrelation is exactly the same, but the OFC compressed pulse width is approximately $0.28 \cdot \tau_C$, as compared with the single carrier compressed pulse width of approximately a bit width, $\tau_B = 7 \cdot \tau_C$. This provides the measure of the processing gain (PG), which is the ratio of the compressed pulse width to the bit length, or in this case, PG=49.

Figure 6:
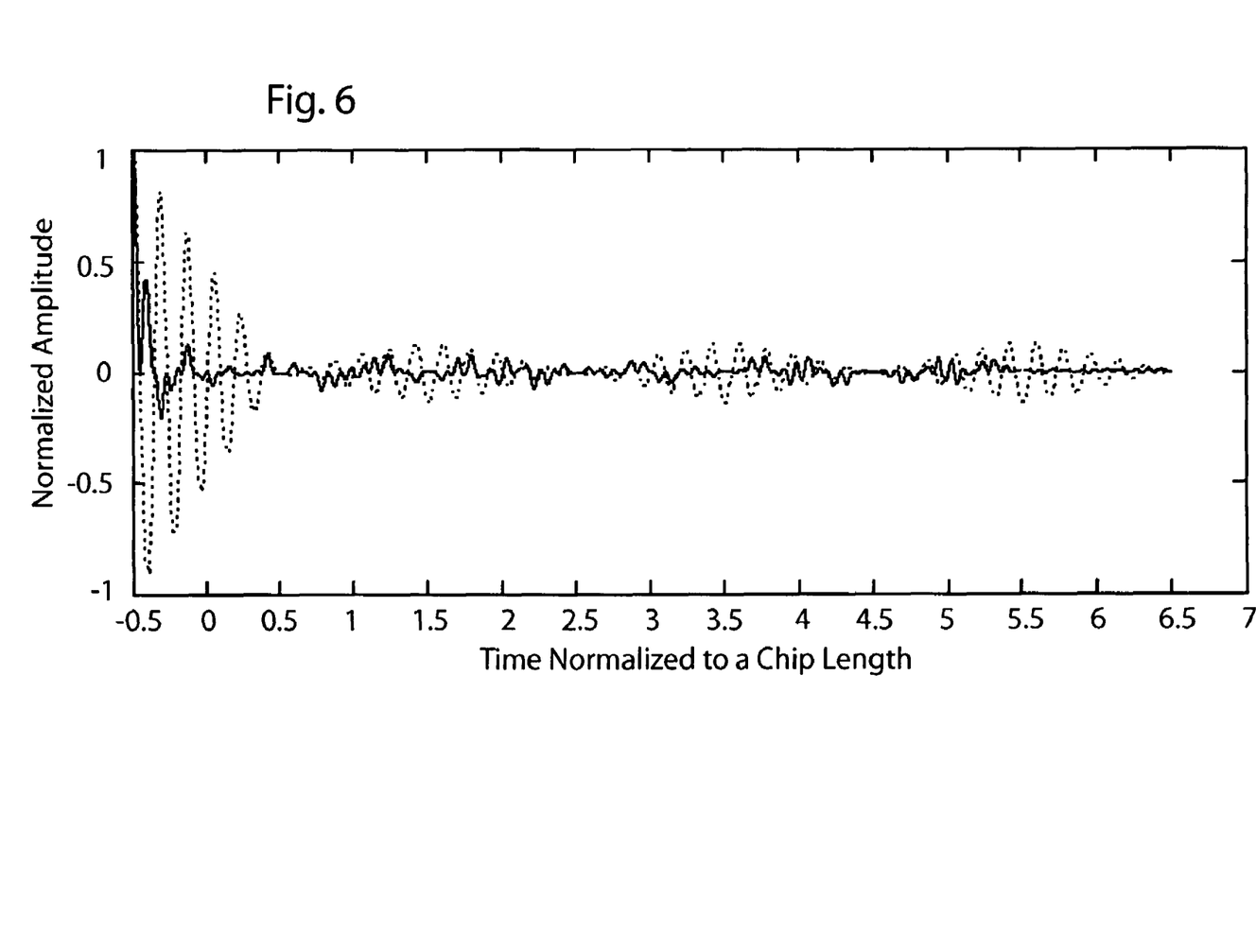
FIG. 6 shows the time autocorrelation of a single carrier PN code and a PN-OFC signal having a 7 chip Barker code modulating the chips of both signals.

In addition to the OFC coding, each chip can be weighted as ±1, giving a pseudo noise (PN) code in addition to the OFC, namely PN-OFC. This does not provide any additional processing gain since there is no increase in the time bandwidth product, but does provide additional code diversity for tagging. FIG. 6 shows the autocorrelation of a 7 bit Barker code applied to an OFC shown with a solid line and a single carrier frequency shown with a dashed line. The pseudo noise code has a compressed pulse width of $2 \cdot \tau_C$, or a $PG_{PN}=7$ as compared $PG_{PN-OFC}=49$. The compressed pulse width of the OFC is a function of the bandwidth spread and not the pseudo noise code; yielding comparable pulse-width and side lobes results, as shown in FIG. 5 without pseudo noise code and FIG. 6 with pseudo noise code.

Figure 7:
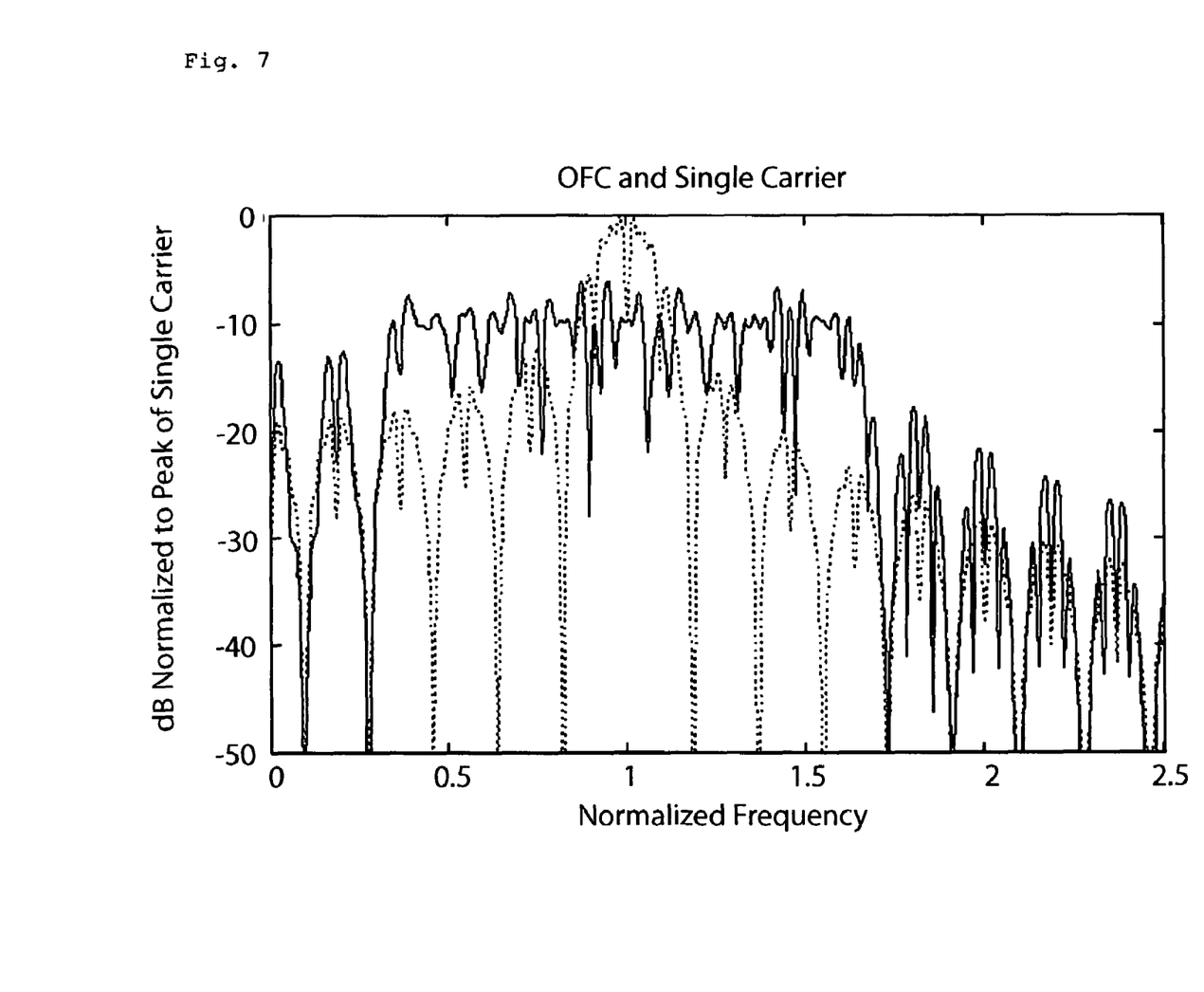
FIG. 7 shows the frequency response of a 7 chip PN-OFC signal and a single carrier signal.

FIG. 7 compares the waveforms of the frequency response of a 7-chip PN-OFC represented with a solid line and a single carrier pseudo noise signal represented with a dashed line. As shown, each has approximately the same time lengths with the magnitudes normalized to the time amplitude peak of the pseudo noise response. The PN-OFC has an increased processing gain and a narrower compressed pulse peak over just the pseudo noise sequence, proportional to the bandwidth spreading of the OFC.

In the preferred embodiment, apparatus, systems, devices and methods of the present invention provides an orthogonal frequency coding technique for SAW sensors incorporating weighted reflectors to increase the number of chips that can be implemented, and consequently, increases the code density. The reflectors are weighted reflector grating that are designed for implementation of orthogonal frequency coded surface acoustic wave sensors. By spatially weighing reflectors, a variety of reflector stopband responses are implemented.

OFC waveforms can be employed in SAW devices using shorted periodic reflector gratings. Each chip of the OFC waveform is implemented using a shorted periodic reflector grating. The grating periodicities are chosen so that the grating center frequencies correspond to the chip carrier frequencies. In order to keep the chip length approximately constant, each grating must contain different numbers of electrodes as the periodicity changes. This is a direct result of the orthogonality condition. The equation used to find the grating electrode counts is shown below.

$$N_j = \tau_c \cdot f_j \tag{1}$$

This equation shows that the grating electrode count is directly proportional to frequency. In addition, the normalized metal thickness also increases with frequency. Therefore, in a device fabricated with a single metal thickness for all reflectors, the magnitude of SAW reflection for each chip will not be equal.

The tag information is provided by a series of reflectors that map into a known chip sequence. The time-chip-sequence is coded by differentially OFC and PN sequences. Therefore, the implementation of OFC sensors requires reflectors having differing local carrier frequencies. In the case of narrow fractional bandwidths or high reflectivity, $LiNbO_3$ for example, it is desirable to adjust the reflectivity per electrode in the various chips.

Figure 9:
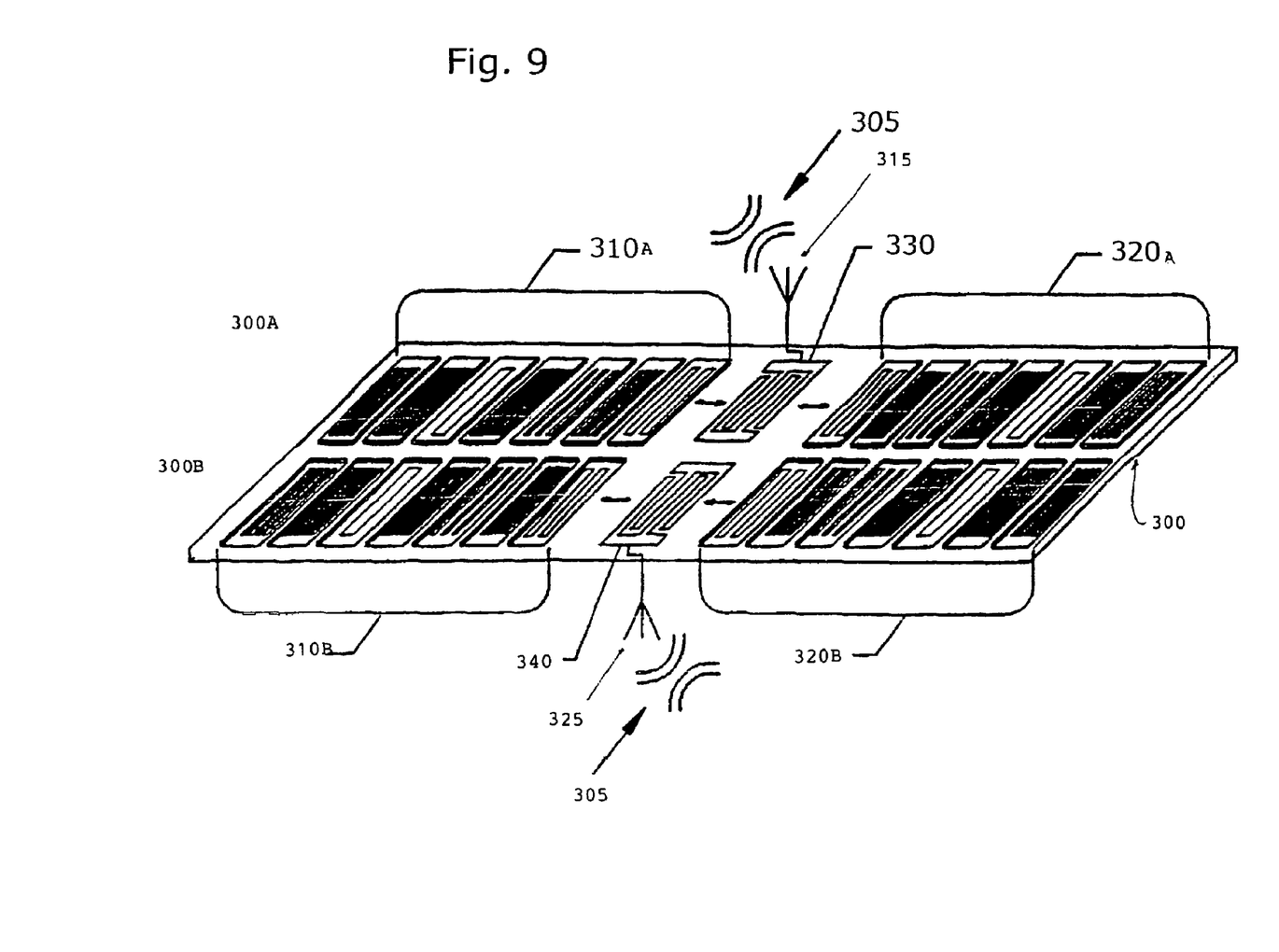
FIG. 9 is a schematic diagram of an example of an OFC SAW sensor implementation.
Figure 10:
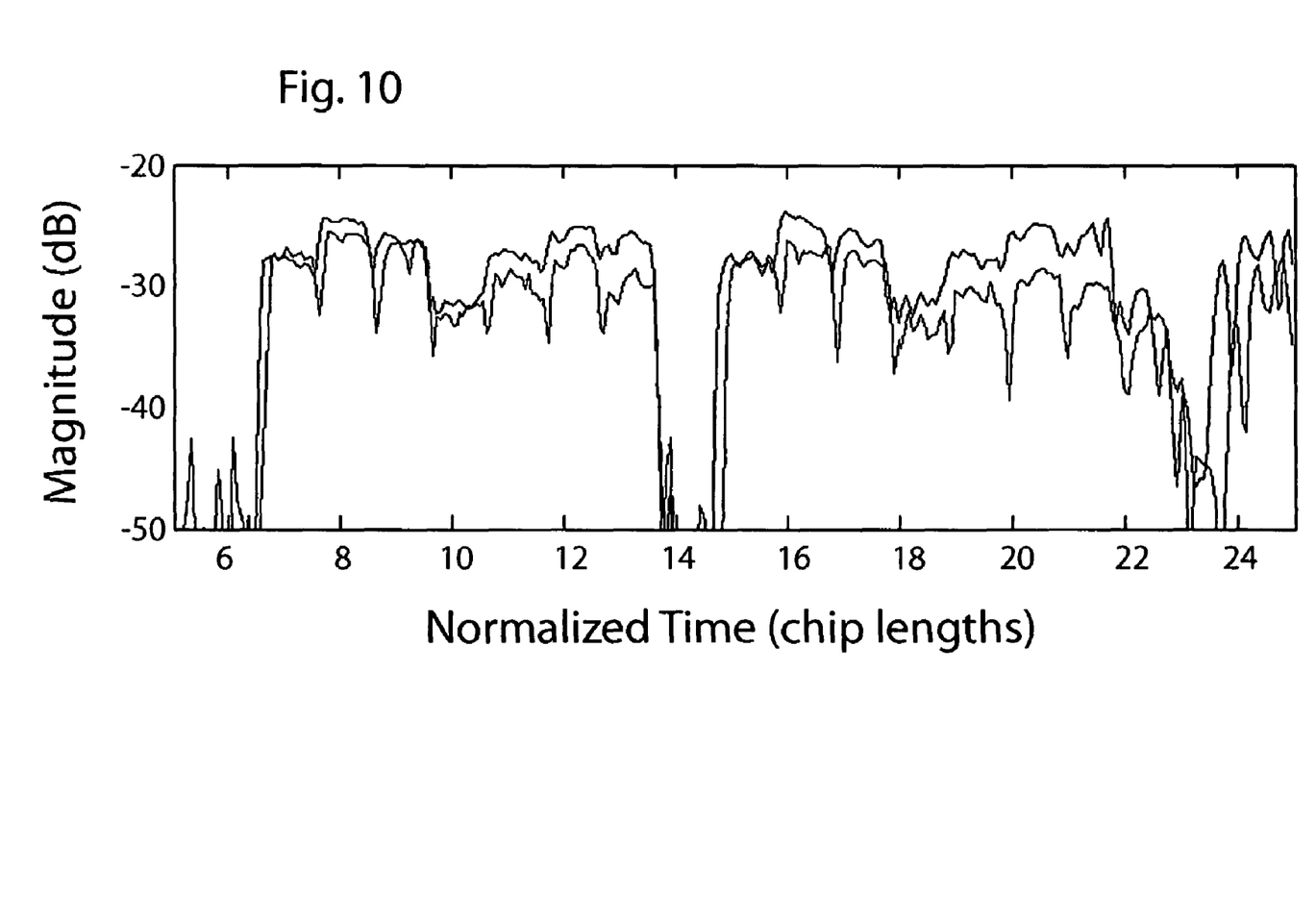
FIG. 10 shows two compressed pulses having a differential time delay between pulses.

According to the present invention, multiple wideband transducer and antenna pairs and plural reflector gratings are fabricated on a single SAW sensor or tag as shown in FIG. 9. The fundamental processing gain limitation for each sensor or tag is the gain bandwidth product (GBP), which affects the insertion loss (loss is inversely proportional to the material coupling coefficient and fractional bandwidth).

The methods, systems, apparatus and devices of the present invention the loss of the device is reduced by using multiple transducer/antenna pairs with each of the multiple transducer/antenna pairs having a different center frequency. Using this technique, the device appears to look like a multi-transceiver device. In terms of bandwidth, the bandwidth of each transducer/antenna pair is inversely proportional to the number of transducer/antennas pairs used. The overall bandwidth of the device is the sum of the bandwidth of the transducer/antenna pairs. Implementing a SAW sensor or tag with multiple transducer/antenna pairs significantly improves the performance of the device.

Figure 8:
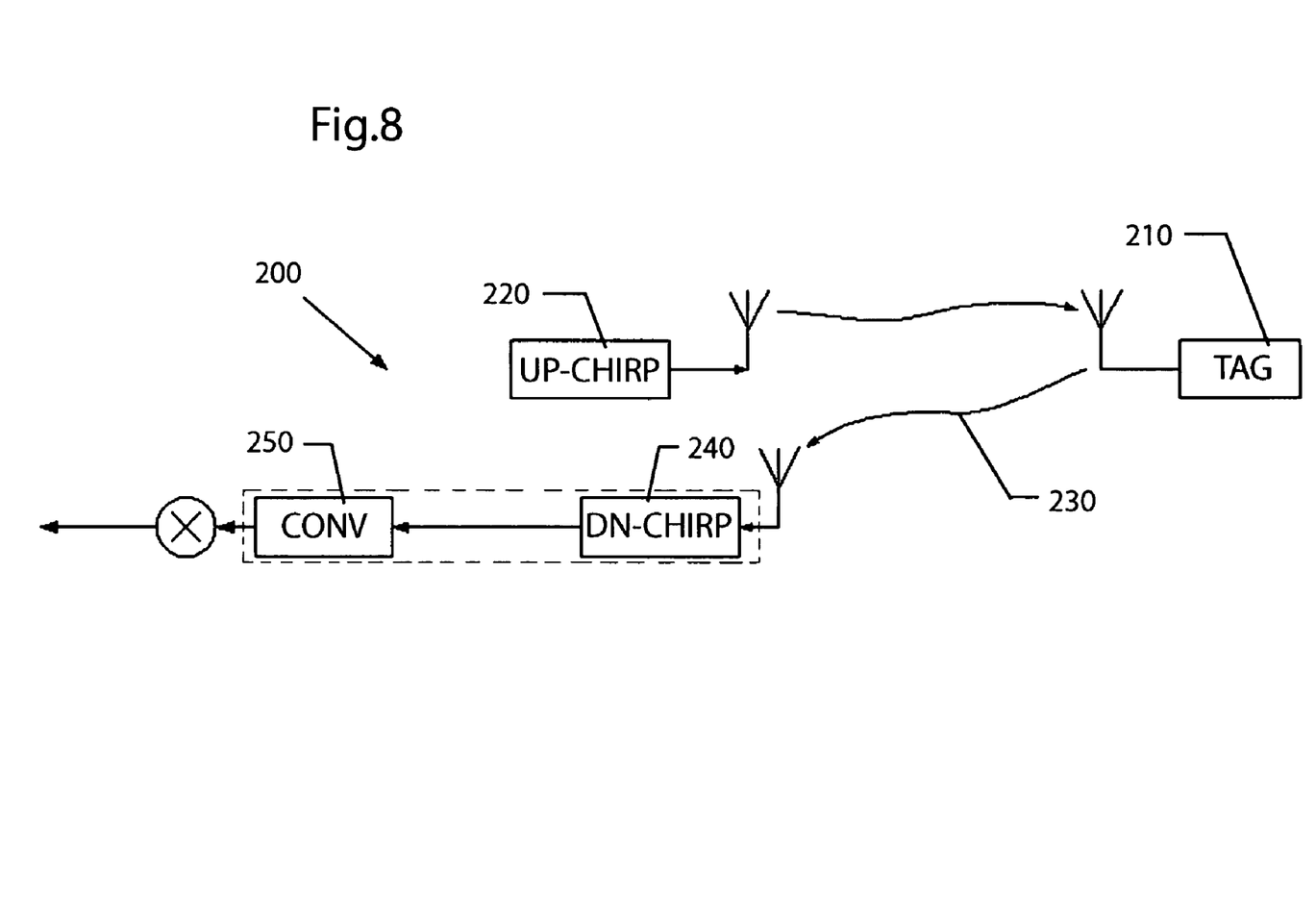
FIG. 8 is a block diagram of an example of an OFC SAW system according to the present invention.

An example configuration of a OFC SAW system 200 is shown in the block diagram of FIG. 8. The SAW sensor or tag 210 is interrogated with a linear stepped up chirp 220 possessing the same time length and bandwidth as the tag impulse response 230. For a given peak amplitude, the chirp provides increased power over a given bandwidth as compared to a simple RF tone burst. A noise-like tag response signal 230 is returned from the identification tag 210. Since orthogonal frequencies are used, the intersymbol interference is drastically reduced when compared with a conventional PN sequence. A band-limited version of the tag's impulse response results after a down chirp 240 is applied. The signal is then match filtered to produce a compressed pulse.

The OFC apparatus, systems, devices and methods of the present invention are readily applied to SAW sensing applications. An example of a multi-transducer/antenna SAW sensor or tag 300 according to the present invention is shown in FIG. 9. In this example, the SAW sensor or tag 300 includes two channels comprising two wideband input transducers 330 and 340 paired with two antennas 315 and 225 and two banks of reflectors 300A and 300B. One bank of reflectors 300A includes reflector gratings 310A and 320A and the second bank of reflectors 300B includes of reflectors 310B and 320B and the device operates in the differential mode. The first bank of reflectors 310A and 320A are coupled with the first transducer 330 and antenna 315 pair and the second banks of reflectors 310B and 320B are coupled on either side of the second transducer 340 and antenna 325 pair as shown in FIG. 9.

The device receives an orthogonal interrogation signal 305, and in response, transmits an orthogonal frequency coded response signal 305 to identify the device being interrogated. The frequencies of the transducer, antenna and grating will be different for each parallel channel. The idea is to have two or more parallel channels, each having differing frequencies and codes, each optimized for bandwidth and matching, each having narrower fractional bandwidths than achievable with a single embodiment While the example shown in FIG. 9 shows two transducer/antenna pairs coupled with two banks of reflectors configured as two parallel channels, alternative configurations may be substituted. For example, the device may include multiple channels with one reflector on one side of each of the transducer/antenna pairs, a bank of reflectors on one side of the transducer/antenna pairs, or a combination thereof, or a bank of reflectors on each side of the transducer/antenna pairs as shown in FIG. 9 and the transducer may be a unidirectional transducer. Using multiple transducer/antenna pairs, each with a different center frequency allows for a wider bandwidth, reduces the losses of the device and improves the overall performance.

Figure 11A:
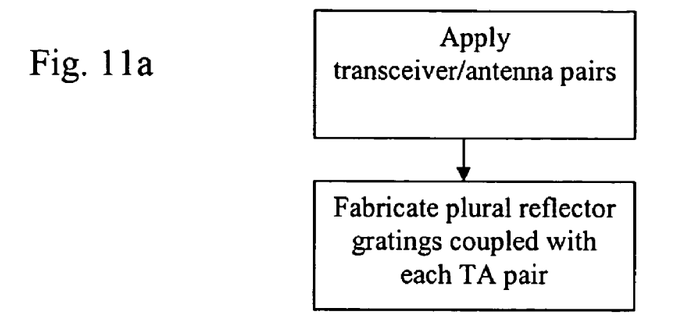
FIG. 11*a* is a flow diagram showing the steps of producing an orthogonal frequency coded surface acoustic wave device.
Figure 11B:
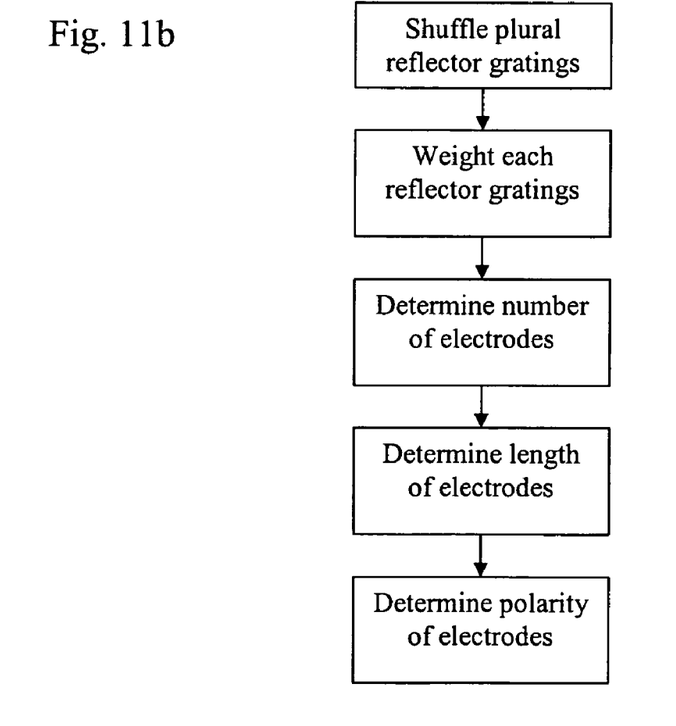
FIG. 11*b* is a flow diagram of the steps for fabricating the plural reflector gratings for each channel.

FIG. 11a is a flow diagram showing a method for producing a surface acoustic wave device which includes the steps of applying at least two transceiver/antenna pairs to a substrate and fabricating plural reflector grating on said substrate to form at least two banks of reflectors, said at least two banks of reflector gratings coupled with the at least two transceiver/antenna pairs for producing an orthogonal frequency coded signal, each of the at least two transceiver/antenna pairs and corresponding bank of reflectors having a different center frequency. The flow diagram shown in FIG. 11b shows the step for fabricating the plural reflector gratings that are coupled with each of the transceiver/antenna pairs. To produce different orthogonal frequency coded signals, the plural reflector gratings are shuffled to produce a different orthogonal frequency coded signal, wherein the code is determined by the order in which the contiguous orthogonal frequencies are used. In an embodiment, each of the plural reflector gratings are weighted. In the fabrication process, a number of electrodes for each of said plural weighted reflector gratings is determined according to $N_j = \tau_c \cdot f_j$ so that a chip length is approximately constant. The number of electrode lengths is not uniform, therefore the number of electrode lengths is determined and polarity is assigned to each of the electrodes.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A surface acoustic wave device comprising:
    a substrate;
    at least two banks of reflectors fabricated on said substrate for producing at least two contiguous stepped frequencies as an orthogonal coded signal, wherein each of said at least two contiguous stepped frequencies have a different center frequency within a bandwidth; and
    at least two transducer and antenna pairs each tuned to a corresponding one of the different center frequencies on said substrate, each of said at least two transducer/antenna pairs coupled with one of said at least two banks of reflectors for receiving an orthogonal frequency coded signal generated by a corresponding one of said at least two banks of reflectors, wherein the bandwidth of each transducer/antenna pair is inversely proportional to the number of transducer/antenna pairs used, and wherein the at least two transducer/antenna pairs output the orthogonal coded signal upon interrogation.

2. The surface acoustic wave device of claim 1, wherein each of said at least two banks of reflectors comprises:
    plural different first reflector gratings coupled together; and
    plural different second reflector gratings coupled together, said first and second plural reflector gratings fabricated on opposite sides of the corresponding one of the at least two transducer/antenna pairs.

3. The surface acoustic wave device of claim 1, wherein each of said plural different first and second reflector grating comprises:
    a first reflector grating producing a first frequency; and
    a second reflector grating producing a second frequency, said first frequency and said second frequency are orthogonal within a bandwidth, wherein the bandwidth of the surface acoustic wave device is the sum of the bandwidth of the transducer/antenna pairs.

4. The surface acoustic wave device of claim 3, wherein each of said first and said second reflector gratings comprise:
    a variable weighted reflector grating to increase code diversity.

5. The surface acoustic wave device of claim 4, wherein each of said a variable weighted reflector gratings comprise:
    a spatially weighted reflector grating to generate a stopband response.

6. The surface acoustic wave device of claim 1, further comprising:
    a sensing device for sensing a condition of an environment within range of said sensing device, said sensing device attached with said substrate.

7. The surface acoustic wave device of claim 6, wherein said sensing device comprises:
    at least one of a temperature sensor, a biological sensor and a chemical sensor.

8. A system for identifying a surface acoustic wave device comprising:
    the device having at least two channels, each channel comprising:
        a bank of reflectors fabricated on said tag, so that the at least two channels produce at least two contiguous stepped frequencies as an orthogonal coded signal;
        plural transducer/antenna pairs, each transducer/antenna pair coupled with a different bank of reflectors for receiving an orthogonal interrogation signal, and transmits the orthogonal coded signal generated by said banks of reflectors for identifying said surface acoustic wave device in response to said orthogonal interrogation signal, wherein each of said transducer/antenna pairs and corresponding bank of reflectors having a different center frequency; and
    a transceiver in communication with said surface acoustic wave device for transmitting said orthogonal interrogation signal to said surface acoustic wave device and receiving said orthogonal coded signal from said surface acoustic wave device in response, wherein using multiple transducer/antenna pairs each having a different center frequency which increases the device bandwidth, reduces device loss and improves performance.

9. The system of claim 8, wherein each bank of reflectors includes:
at least one reflector on at least one side of each of said transducer/antenna pairs for producing the orthogonal coded signal.

10. The system of claim 8, wherein each bank of reflectors includes:
plural reflector gratings on at least one side of said transducer/antenna pair to produce plural orthogonal contiguous frequencies that are contiguous in time and are not sequential in frequency, wherein said plural orthogonal contiguous frequencies form said orthogonal coded signal.

11. The system of claim 8, wherein said surface acoustic wave device comprising:
the sensor for sensing an environment within proximity to said sensor to produce a signal proportional to the environmental adjacent to said sensor.

12. The system of claim 11, wherein said sensor comprises:
at least one of a temperature sensor, a biological sensor and a chemical sensor.

13. A method for producing a surface acoustic wave device comprising the steps of:
applying at least two transceiver/antenna pairs to a substrate;
fabricating plural reflector gratings on said substrate to form at least two banks of reflector gratings each of said at least two banks of reflector gratings coupled with a different one of said at least two transceiver/antenna pairs for producing at least two contiguous stepped frequencies as an orthogonal frequency coded signal, in response to an interrogation signal, each of said at least two transceiver/antenna pairs and corresponding bank of reflector gratings having a different center frequency.

14. The method of claim 13, further comprising the step of:
shuffling the plural reflector gratings to produce a different orthogonal frequency coded signal, wherein the code is determined by the order in which the contiguous orthogonal frequencies are used.

15. The method of claim 13, further comprising the step of:
weighting each of said plural reflector gratings, wherein each said plural weighted reflectors gratings generate an orthogonal frequency coded signal.

16. The method of claim 15, further comprising the step of:
determining a number of electrodes for each of said plural weighted reflector gratings according to $N_j = \tau_c \cdot f_j$ so that a chip length is approximately constant.

17. The surface acoustic wave device of claim 16, wherein a configuration of the plural electrodes is selected from open, shorted or segmented, or a combination thereof, and weighted or uniform.

18. The surface acoustic wave device of claim 16, wherein a configuration of the plural electrodes is selected from weighted and uniform.

19. The method of claim 16, further comprising the step of:
determining a number of electrode lengths of said number of electrodes, wherein said number of electrode lengths is not uniform.

20. The method of claim 19, further comprising:
assigning a first polarity to one of said number of electrodes; and
assigning a second polarity to another one of said number of electrodes.

* * * * *